United States Patent [19]

Fischer et al.

[11] Patent Number: 4,582,777

[45] Date of Patent: Apr. 15, 1986

[54] COMPRESSIBLE PRINTING PLATE

[75] Inventors: Kenneth V. Fischer, Billerica; Roy D. Fountain, Lexington; Larry E. Erwin, Bolton; Thomas O. Gavin, Harvard, all of Mass.

[73] Assignee: W. R. Grace & Co., Cambridge, Mass.

[21] Appl. No.: 495,862

[22] Filed: May 18, 1983

[51] Int. Cl.⁴ .................................................. G03C 1/76
[52] U.S. Cl. ..................................... 430/271; 430/276; 430/935; 101/376; 101/401.1
[58] Field of Search ............... 430/271, 935, 276, 155, 430/523; 101/395, 401.1, 376, 379; 428/319.1, 319.3, 319.7, 318.4

[56] References Cited

U.S. PATENT DOCUMENTS

| | | |
|---|---|---|
| 3,147,698 | 9/1964 | Ross . |
| 4,112,841 | 9/1978 | Deshpande .......................... 101/376 |
| 4,120,721 | 10/1978 | Ketley et al. ....................... 430/306 |
| 4,162,919 | 7/1979 | Richter et al. ..................... 430/271 |
| 4,303,721 | 12/1981 | Rodriguez . |
| 4,332,873 | 6/1982 | Hughes et al. ..................... 430/273 |

FOREIGN PATENT DOCUMENTS

| | | |
|---|---|---|
| 973955 | 11/1964 | United Kingdom . |
| 1002212 | 8/1965 | United Kingdom . |
| 1252370 | 11/1971 | United Kingdom . |
| 2013917 | 8/1979 | United Kingdom . |

OTHER PUBLICATIONS

FLEXOgraphic Technical Journal, Jan. 1982, pp. 7, 18 and 28-38; May 1982, pp. 9 and 68-70.

*Primary Examiner*—Won H. Louie
*Attorney, Agent, or Firm*—John J. Wasatonic; William L. Baker

[57] ABSTRACT

An improved compressible printing plate in which a liquid photocurable material is bonded directly to a compressible material during exposure to ultraviolet radiation. The compressible printing plate is free of any dimensionally stable material between the liquid photocurable material and the compressible material.

21 Claims, 1 Drawing Figure

COMPRESSIBLE PRINTING PLATE

This invention relates to an improved compressible printing plate and a method of making the plate. The printing plate of the present invention includes a liquid photocurable material which is used as a printing face and a compressible material. As the photocurable material is cured from the liquid to the solid state, it is bonded directly to the compressible material. In a preferred embodiment, the compressible material is translucent to ultraviolet radiation, thus allowing the printing plate to be back exposed.

BACKGROUND

It is known that print quality can be improved by insertion of a compressible material behind a photopolymer or rubber flexographic plate. Additionally, it is known that press bounce and plate wear may be reduced using a compressible material behind the printing plate. Generally, in these prior art printing plates, the compressible material was adhered to the side of the printing plate base layer away from the printing face. Alternatively, the compressible material was adhered to the printing face side of the plate and an intervening layer of dimensionally stable material, such as mylar or paper, was located between the compressible material and the photocurable material.

Additionally, prior compressible printing plates were not translucent to ultraviolet radiation, and, therefore such plates could not be backexposed. Back exposure allows the floor of the photocurable material to develop more fully and, generally, the printing plates made in this manner are more durable than those developed solely by front exposure.

In the past, attempts have been made to position the photopolymer layer directly on top of the compressible layer of the printing plate without an intervening stabilizing layer. In such cases, a layer of solid photopolymer was laminated onto the compressible layer. However, because of the nature of lamination, strong adhesion between the solid photopolymer and the compressible material remained as a problem.

Additionally, since the solid photopolymer cures upon exposure to ultraviolet light, the uncured photopolymer had to be covered by foil or similar material until it was used. Further, since plates using a solid photopolymer layer were pre-made, the final user could not adjust the depth of the printing face nor the depth of the underlying compressible layer.

SUMMARY OF THE INVENTION

In accordance with the present invention a compressible printing plate is provided having a base layer chosen from plastic such as mylar, or metal such as steel, or paper such as a tag stock and an adhesive material or tie coat. A compressible layer is provided directly on top of the base layer. In a preferred embodiment the compressible layer is comprised of a platisol foam and a tie coat. Alternatively this compressible layer may contain a urethane foam, elastomer foam or organosol foam. A liquid photocurable layer is directly over the compressible layer. In an alternate embodiment the base layer is composed of some combination of a metal, a plastic and/or a paper.

By one aspect of the invention, a method of producing the compressible printing plate is provided.

An advantage of the present invention is that the compressible material is directly bondable by ultraviolet light to the liquid photocurable layer during curing of the photopolymer. This allows formation of a compressible printing plate that is free of any dimensionally stable layer, such as mylar or paper, between the compressible layer and the liquid photocurable layer.

A further advantage is that the printing plate of present invention may be translucent ultraviolet radiation and therefore the photopolymer can be cured through back exposure, front exposure or some combination of front and back exposure.

A still further advantage is that print quality is improved when the photocurable material is adhered directly to the compressible material. Additionally, the amount of photocurable material needed to make a plate is reduced.

DESCRIPTION OF THE INVENTION

Figure 1:
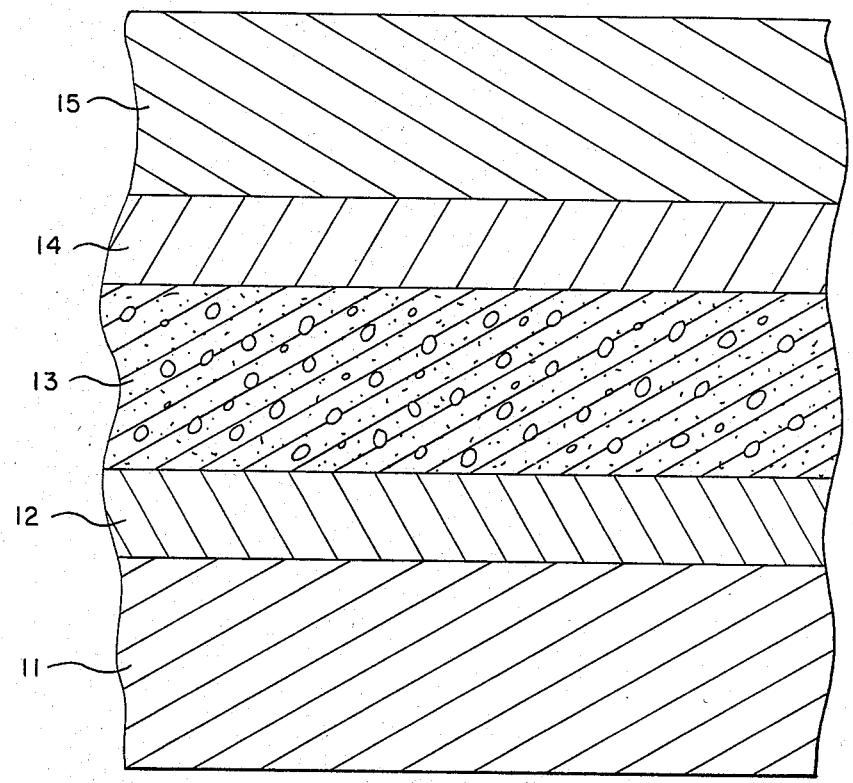
FIG. 1 is an enlarged sectional view of a compressible printing plate incorporating the present invention.

FIG. 1 shows a compressible printing plate of the present invention. The printing plate of FIG. 1 includes a base layer 11. The base layer may be a film forming plastic, such as addition polymers, vinylidene polymers, e.g., vinyl chloride, vinylidene chloride copolymers with vinyl chloride, vinyl acetate, styrene, isobutylene and acrylonitrile, vinylchloride copolymers with the latter polymerizable monomers, the linear condensation polymers such as the polyester, e.g. polyethylene terephthalate, the polyamides, e.g. polyhexamethylene sebacamide; polyester amides, e.g. polyhexamethyleneadipamide/adipate; and the like. The base layer 11 may also be a metal. Suitable metals include steel, aluminum, magnesium, copper, chromium and the like. It is also suitable to use a base layer composed of a metal to which a plastic is adhered. A paper, such as tag stock, may be used as the base layer alone or in combination with a plastic or a metal. The base layer will have a thickness of about 5 mils to 20 mils depending on the material selected.

An adhesive material 12 is provided above the base layer. A tie coat may be used in place of the adhesive material. Directly above the adhesive material is the compressible layer 13 and tie coat 14. The liquid photocurable layer 15 is directly above tie coat 14.

The compressible layer 13 is preferably a plastisol foam or other material which is translucent to ultraviolet radiation if the plate will be back exposed. Other suitable materials include organosols, elastomer foams and urethane foam. Additionally, the compressible layer may also contain a solid platisol, elastomer, urethane or organosol. The compressible material may be foamed before or after it is applied to the base layer. The void volume of the compressible layer is at least about 20% and no more than about 75%; preferably about 40% to about 60% and more preferably about 40% to about 50%. It should be understood that if a portion of the compressible layer is solid, the preferred range will change. However, the void volume of the compressible layer as a whole will remain in the range of at least about 20% to about 75%. The compressible layer will be in the range of about 15 mils thick to about 150 mils thick. In those cases where front exposure is to be used, compressible materials which are not translucent to ultraviolet radiation may be used. Fillers and pigments and/or dyes may be included in the compressible material, the tie coat and/or the base layer especially where back exposure will not be used.

Preferred tie coats include polyvinylidene chloride and isocyanates; however, selection of a tie coat is deemed to be well within the ability of those skilled in the art.

mulation 6 represents a solid plastisol. All numbers used in Table 1 represent parts per hundred of resin. The plastisol foams were made by mixing the ingredients of Formulations 1-5 respectively in a Ross planetary mixer; however, it should be understood that use of a particular mixer is not critical to the present invention.

TABLE 1

| INGREDIENTS | FORMULATION | | | | | |
|---|---|---|---|---|---|---|
| | 1 | 2 | 3 | 3 | 5 | 6 |
| PVC Dispersion Grade Resin | 0.0 | 0.0 | 0.0 | 0.0 | 100.0 | 100.0 |
| Vinyl Chloride/Vinyl Acetate Copolymer Dispersion Grade Resin | 100.0 | 100.0 | 100.0 | 100.0 | 0.0 | 0.0 |
| Di-isobutyl Phthalate | 90.0 | 52.5 | 52.5 | 35.0 | 25.0 | 70.0 |
| Oxybis(Benzene Sulfonhydrazide) Dispersion in Plasticizer 1:1 | 4.0 | 4.0 | 4.0 | 4.0 | 0.0 | 0.0 |
| Azodicarbonamide Dispersion in Plasticizer 1:1 | 2.5 | 2.5 | 2.5 | 2.5 | 2.0 | 0.0 |
| Zinc Stearate Dispersion in Plasticizer 1:2 | 5.8 | 5.8 | 5.8 | 5.8 | 3.0 | 0.0 |
| Pulverized Calcium Oxide | 1.0 | 1.0 | 1.0 | 1.0 | 0.0 | 0.0 |
| Stabilizer | 3.0 | 3.0 | 3.0 | 3.0 | 3.0 | 3.0 |
| Trimethylol Propane Trimethacrylate | 10.0 | 10.0 | 10.0 | 10.0 | 15.0 | 0.0 |
| Polymeric Plasticizer | 0.0 | 17.5 | 0.0 | 45.0 | 25.0 | 0.0 |
| Pigment | 0.0 | 0.0 | 0.0 | 1.0 | 0.0 | 1.0 |
| Epoxized Soybean Oil | 0.0 | 0.0 | 0.0 | 0.0 | 5.0 | 5.0 |
| Precipitated Calcium Carbonate | 0.0 | 0.0 | 0.0 | 0.0 | 0.0 | 100.0 |

Inclusion of a solid plastisol, urethane, elastomer or organosol in the compressible layer is particularly useful in those applications wherein only a thin layer of photocurable liquid will be used. Such applications include use on high speed rotary presses such as those used in newspaper printing. In those instances where light absorption is important a black or other dark colored pigment may also be included.

In the present invention, the liquid photopolymer is bonded directly to the compressible layer during exposure to ultraviolet radiation. The omission of any dimensionally stable material between the compressible material and the liquid photocurable layer is an important aspect of the present invention.

It is believed to be within the ability of one skilled in the art to select a liquid radiation curable composition suitable for use in the present invention. Preferred photopolymer compositions include compositions such as those disclosed in U.S. Pat. No. 4,120,721 to Ketley et al, i.e. compositions comprising an acrylic or methacrylic terminated urethane containing polyene, a nonwater soluble vinyl monomer solvent, a polythiol containing at least two thiol groups per molecule and a photoinitiator.

The inventors herein have also discovered that the present invention is applicable in those cases where liquid photocurable materials having the same or different moduli are applied in at least two contiguous layers to the compressible material. Plates resulting therefrom are generally known as multilayer printing plates. Photopolymers such as those disclosed in U.S. Pat. Nos. 4,266,007 and 4,332,873 to Hughes et al. form multilayer printing plates and are suitable for use in the present invention.

The liquid photopolymer layer will be at least about 10 mils thick and no more than about 200 mils thick depending on the material to be printed. Selection of thickness is well within the ability of one skilled in the art.

Formulations 1-5 of Table 1 illustrate formulations of preferred plastisol foams of the present invention. For-

EXAMPLE I

The plastisol foam of Formulation 1 was coated on a mylar base plate in one pass. The mylar base plate had been pretreated with an isocyanate coating. The plastisol foam was gelled under a series of infrared heaters at 250° F. before it was blown and fluxed. The coated plate was fluxed at 325° F.

Thereafter the compressible layer was ground on a Curtin-Hebert grinder to 35 mils and then the compressible layer was coated with a polyvinylidene chloride tie coat. Thereafter, the compressible sheet was cut to size to form a plate suitable for use on the particular flexographic exposure unit selected.

The compressible plate was then fed into the flexographic exposure unit and coated with a liquid photopolymer. Once in the unit, the photopolymer coated plate was exposed through the foam (back exposure) to ultraviolet radiation. When the compressible plate was exposed to ultraviolet radiation, the photopolymer was bonded directly to the compressible layer. Once exposed, the compressible plate underwent the normal procedures, such drying and post exposure.

EXAMPLE II

A solid plastisol of Formulation 6 containing a pigment was coated on casting paper and gelled at 250° F. The plastisol foam of Formulation 5 was coated on the plastisol and then gelled under a series of infrared heaters 250° F. Thereafter the composite was carried through an oven at 350° F. and blown and fluxed.

The compressible layer was then ground to the desired caliper. Thereafter the compressible layer was adhered to a mylar backing which was precoated with an adhesive.

The casting paper was removed from the plastisol. The plastisol was then ground to the desired caliper and coated with polyvinylidene chloride tie coating. Thereafter the compressible sheet was cut to size to form a plate suitable for use on the particular flexographic exposure unit selected.

The compressible plate was fed into the flexographic unit and coated with a liquid photopolymer. Once in the unit, the plate was front exposed to ultraviolet radiation.

When the compressible plate was exposed to ultraviolet radiation, the photopolymer was bonded directly to the compressible layer. Once exposed, the compressible plate underwent the normal procedures, such as drying and postexposure.

It should be understood, that in the present invention the foam may be blown before or after it is coated on the base layer. If it is blown after being deposited, the thickness of the blown foam is dependent on the amount deposited. At a temperature of about 325° F., the blown foam was about twice as thick as the amount coated. The blow ratio can be altered by changing the flux temperature. Suitable flux temperatures are in the range of about 300° F. to about 440° F. Alternatively, the blow ratio can be changed by varying the amount of blowing agents or plasticizer. It should be understood that any suitable mixer and grinder may be used.

We claim:

1. A compressible printing plate comprising, in sequence: a base layer; a compressible layer bonded to the base layer and comprised of a compressible foam material and a tie coat, said compressible layer having a void volume in the range of about 20% to about 75%; and a layer comprising a liquid photocurable material capable of being bonded directly to the compressible layer during exposure to ultraviolet radiation; said printing plate being provided without a dimensionally stable layer between said compressible layer and said layer comprising a liquid photocurable material.

2. The compressible printing plate according to claim 1 wherein said compressible foam material comprises a plastisol foam.

3. The compressible printing plate according to claim 2 wherein said compressible layer further comprises a solid plastisol material.

4. The compressible printing plate according to claim 1 wherein said compressible layer is translucent to ultraviolet radiation.

5. The compressible printing plate according to claim 1 wherein the base layer comprises a metal, a plastic, a paper or some combination thereof.

6. The compressible printing plate according to claim 1 wherein the tie coat is polyvinylidene chloride.

7. The compressible printing plate according to claim 1 wherein the liquid photocurable material comprises an acrylic or methacrylic terminated urethane containing polyene, a non-water soluble vinyl monomer solvent, a polythiol containing at least two thiol groups per molecule and a photoinitiator.

8. The compressible printing plate according to claim 1 wherein the layer comprised of the liquid photocurable material includes at least two contiguous layers containing photocurable compositions having the same or different moduli.

9. The compressible printing plate according to claim 1 wherein the compressible layer has a void volume in the range of about 40% to about 60%.

10. The compressible printing plate according to claim 1 wherein the thickness of the compressible layer is in the range of about 15 mils to about 150 mils.

11. The process according to claim 1 wherein said compressible foam material comprises a plastisol foam.

12. The process according to claim 1 further comprising including a solid plastisol material in said compressible layer.

13. The process according to claim 1 wherein said compressible layer is translucent to ultraviolet radiation and said photopolymer material is exposed through said compressible layer.

14. The process according to claim 1 wherein the base layer comprises a metal, a plastic, a paper or some combination thereof.

15. The process according to claim 1 wherein the tie coat is polyvinylidene chloride.

16. The process according to claim 1 wherein the liquid photocurable material comprises an acrylic or methacrylic terminated urethane containing polyene, a non-water soluble vinyl monomer solvent, a polythiol containing at least two thiol groups per molecule and a photoinitiator.

17. The process according to claim 1 wherein at least two contiguous layers containing photocurable compositions having the same or different moduli are applied to said compressible layer.

18. The process according to claim 1 wherein the compressible layer has a void volume in the range of about 40% to about 60%.

19. The process according to claim 1 wherein the thickness of the compressible layer is in the range of about 15 mils to about 150 mils.

20. A process for forming a compressible printing plate comprising the steps of:
   providing a laminate comprising a base layer and a compressible layer bonded to said base layer and comprising a compressible foam material and a tie coat, said compressible layer having a void volume in the range of about 20% to about 75%.
   applying a liquid photocurable material to the exposed surface of said compressible layer; and
   exposing said photocurable material to ultraviolet radiation to effect bonding of said photocurable material to said compressible layer.

21. A compressible printing plate prepared in accordance with the process of claim 20.

* * * * *